(12) United States Patent
Yang et al.

(10) Patent No.: US 12,532,638 B2
(45) Date of Patent: Jan. 20, 2026

(54) ARRAY SUBSTRATE AND DISPLAY APPARATUS

(71) Applicants: Yunnan Invensight Optoelectronics Technology Co., Ltd., Yunnan (CN); BOE Technology Group Co., Ltd., Beijing (CN)

(72) Inventors: Zongshun Yang, Beijing (CN); Dacheng Zhang, Beijing (CN); Kuanta Huang, Beijing (CN); Xiong Tao, Beijing (CN); Yunchuan He, Beijing (CN); Chao Yang, Beijing (CN)

(73) Assignees: Yunnan Invensight Optoelectronics Technology Co., Ltd., Yunnan (CN); BOE Technology Group Co., Ltd., Beijing (CN)

( * ) Notice: Subject to any disclaimer, the term of this patent is extended or adjusted under 35 U.S.C. 154(b) by 438 days.

(21) Appl. No.: 18/004,893

(22) PCT Filed: Jan. 14, 2022

(86) PCT No.: PCT/CN2022/072076
§ 371 (c)(1),
(2) Date: Jan. 10, 2023

(87) PCT Pub. No.: WO2023/133815
PCT Pub. Date: Jul. 20, 2023

(65) Prior Publication Data
US 2024/0251633 A1    Jul. 25, 2024

(51) Int. Cl.
*H10K 59/80*    (2023.01)
*H10K 59/122*    (2023.01)

(52) U.S. Cl.
CPC ..... *H10K 59/80521* (2023.02); *H10K 59/122* (2023.02)

(58) Field of Classification Search
None
See application file for complete search history.

(56) References Cited

U.S. PATENT DOCUMENTS

2018/0123081 A1    5/2018    Baik et al.
2018/0301521 A1    10/2018    Yang
(Continued)

FOREIGN PATENT DOCUMENTS

CN    105845711 A    8/2016
CN    108022954 A    5/2018
(Continued)

OTHER PUBLICATIONS

International Search Report & Written Opinion mailed Sep. 19, 2022, regarding PCT/CN2022/072076.

*Primary Examiner* — Michelle Mandala
(74) *Attorney, Agent, or Firm* — Intellectual Valley Law, P.C.

(57) ABSTRACT

An array substrate is provided. The array substrate includes a cathode layer extending across a plurality of subpixel regions and an inter-subpixel region. The cathode layer includes a plurality of first ring structures respectively in a plurality of first regions of the inter-subpixel region, a respective first region of the plurality of first regions surrounding a respective subpixel region of the plurality of subpixel regions. A respective first ring structure of the plurality of first ring structures protrudes away from a base substrate, forming a ridge.

17 Claims, 12 Drawing Sheets

(56) References Cited

U.S. PATENT DOCUMENTS

| | | | |
|---|---|---|---|
| 2019/0058022 A1 | 2/2019 | Baik et al. | |
| 2019/0096971 A1 | 3/2019 | Ukigaya | |
| 2019/0198590 A1 | 6/2019 | Kim et al. | |
| 2020/0194705 A1 | 6/2020 | Kim et al. | |
| 2021/0043705 A1 | 2/2021 | Lim et al. | |
| 2021/0091334 A1 | 3/2021 | Heo et al. | |
| 2021/0202651 A1 | 7/2021 | Im et al. | |
| 2021/0233980 A1 | 7/2021 | Lv et al. | |
| 2021/0335985 A1* | 10/2021 | Huang | H10K 59/122 |
| 2022/0367581 A1 | 11/2022 | Wang et al. | |

FOREIGN PATENT DOCUMENTS

| | | |
|---|---|---|
| CN | 109166882 A | 1/2019 |
| CN | 109411613 A | 3/2019 |
| CN | 109873023 A | 6/2019 |
| CN | 110010643 A | 7/2019 |
| CN | 110299389 A | 10/2019 |
| CN | 111668382 A | 9/2020 |
| CN | 212342660 U | 1/2021 |
| CN | 112542556 A | 3/2021 |
| CN | 113097417 A | 7/2021 |
| CN | 113130536 A | 7/2021 |
| KR | 20200072964 A | 6/2020 |
| KR | 20210017179 A | 2/2021 |
| WO | 2018157421 A1 | 9/2018 |

\* cited by examiner

| CDL |
|---|
| EIL |
| ETL2 |
| HBL |
| EML3 |
| HTL3 |
| HTL2 |
| HIL2 |
| CGL |
| ETL1 |
| EML2 |
| EML1 |
| HTL1 |
| HIL1 |
| AD |

FIG. 11

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/072076, filed Jan. 14, 2022, the contents of which are incorporated by reference in the entirety.

TECHNICAL FIELD

The present invention relates to display technology, more particularly, to an array substrate and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present disclosure provides an array substrate, comprising a cathode layer extending across a plurality of subpixel regions and an inter-subpixel region; wherein the cathode layer comprises a plurality of first ring structures respectively in a plurality of first regions of the inter-subpixel region, a respective first region of the plurality of first regions surrounding a respective subpixel region of the plurality of subpixel regions; and a respective first ring structure of the plurality of first ring structures protrudes away from a base substrate, forming a ridge.

Optionally, the cathode layer further comprises a plurality of first portions in the plurality of subpixel regions, respectively; and wherein a first height of the respective first ring structure relative to a surface of the base substrate is greater than a second height of a respective first portion of the plurality of first portions relative to the surface of the base substrate.

Optionally, the cathode layer forms a first groove in the inter-subpixel region.

Optionally, the cathode layer further comprises a second portion in a second region of the inter-subpixel region, the second portion being a base of the first groove.

Optionally, a first height of the respective first ring structure relative to a surface of the base substrate is greater than a third height of the second portion relative to the surface of the base substrate.

Optionally, wherein the cathode layer further comprises a plurality of first portions in the plurality of subpixel regions, respectively; and wherein a second height of a respective first portion of the plurality of first portions relative to a surface of the base substrate is greater than a third height of the second portion relative to the surface of the base substrate.

Optionally, the second portion is a unitary portion extending throughout the second region in the inter-subpixel region between adjacent subpixel regions of the plurality of subpixel regions.

Optionally, the second portion protrudes away from the base substrate.

Optionally, the cathode layer further comprises a plurality of second ring structures respectively in a plurality of third regions of the inter-subpixel region, a respective third region of the plurality of third regions surrounding a respective first region; and wherein a respective second ring structure of the plurality of second ring structures is connected to the respective first ring structure.

Optionally, the cathode layer forms a first groove in the inter-subpixel region; and portions of the plurality of second ring structures form side walls of the first groove.

Optionally, a first height of the respective first ring structure relative to a surface of the base substrate is greater than a fourth height of the respective second ring structure relative to the surface of the base substrate.

Optionally, the cathode layer further comprises a second portion in a second region of the inter-subpixel region, the second portion being a base of the first groove; and the respective second ring structure is a step connecting the respective first ring structure to the second portion.

Optionally, the array substrate further comprises a pixel definition layer; wherein the pixel definition layer comprises a plurality of third ring structures spaced apart from each other; and a respective third ring structure of the plurality of third ring structures defines the respective subpixel region.

Optionally, an orthographic projection of the respective third ring structure on the base substrate at least partially overlaps with an orthographic projection of the respective first ring structure on the base substrate, and at least partially overlaps with an orthographic projection of a respective second ring structure on the base substrate.

Optionally, the array substrate further comprises a planarization layer on a side of the pixel definition layer closer to the base substrate; wherein the respective third ring structure comprises a first sub-ring structure and a second sub-ring structure, the first sub-ring structure connected with the second sub-ring structure; the first sub-ring structure is not in contact with the planarization layer and is on a side of a respective anode away from the planarization layer; and the second sub-ring structure is at least partially in contact with the planarization layer.

Optionally, an orthographic projection of the first sub-ring structure on the base substrate at least partially overlaps with an orthographic projection of the respective first ring structure on the base substrate.

Optionally, the cathode layer further comprises a plurality of second ring structures respectively in a plurality of third regions of the inter-subpixel region, a respective third region of the plurality of third regions surrounding a respective first region; and an orthographic projection of the second sub-ring structure on the base substrate at least partially overlaps with an orthographic projection of a respective second ring structure on the base substrate.

Optionally, the array substrate further comprises a planarization layer on a side of the cathode layer closer to the base substrate; wherein the array substrate further comprises a second groove in the inter-subpixel region and partially extending into the planarization layer; and a pixel definition layer is at least partially absent in second groove.

Optionally, in a cross-section along a plane perpendicular to a surface of the base substrate, the cathode layer has a structure between two adjacent subpixel regions that first protrudes away from the base substrate forming a first ridge, then steps down onto a first intermediate step, then further steps down onto a base of a first groove, then steps up onto a second intermediate step, then further steps up and protrude away from the base substrate forming a second ridge.

In another aspect, the present disclosure provides a display apparatus, comprising the array substrate described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

FIG. 11 is a schematic diagram illustrating the structure of an organic layer in an array substrate in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a cathode layer extending across a plurality of subpixel regions and an inter-subpixel region. Optionally, the cathode layer comprises a plurality of first ring structures respectively in a plurality of first regions of the inter-subpixel region, a respective first region of the plurality of first regions surrounding a respective subpixel region of the plurality of subpixel regions. Optionally, a respective first ring structure of the plurality of first ring structures protrudes away from a base substrate, forming a ridge.

As used herein, the term "ring" or "ring structure" may have various appropriate shapes such as a square, rectangle, triangle, doughnut, or another shape. As used herein, a ring structure does not require that the ring shape be unbroken, and the term is intended to encompass structures that are substantially closed, but that comprise a break or a gap in the ring shape. In one example, the ring structure may be a complete ring structure. In another example, the ring structure may be an incomplete ring structure, for example, having a break or gap in the ring shape. In another example, the incomplete ring structure may have a "C" shape or a "U" shape.

Figure 1:
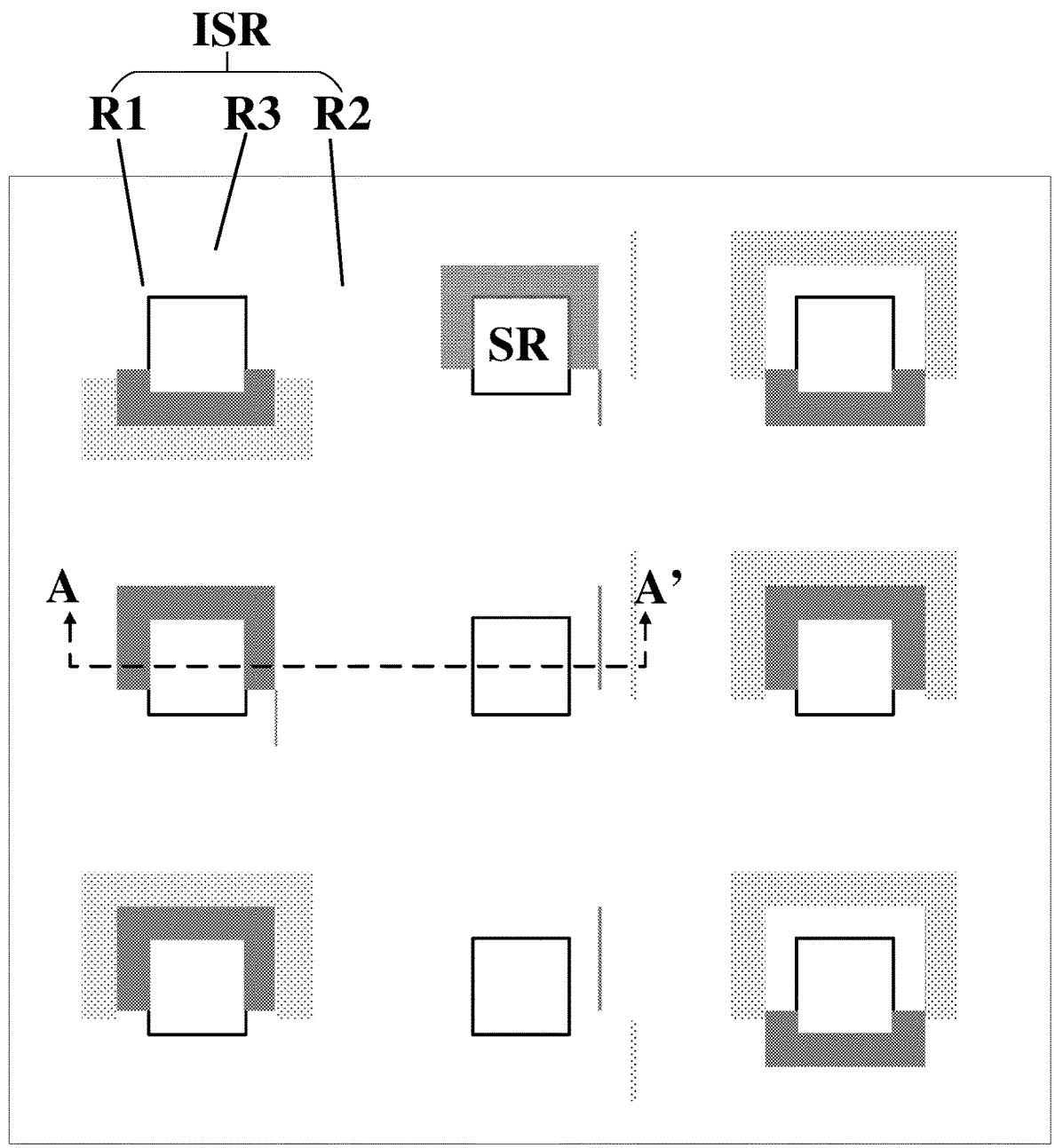
FIG. 1 is a plan view of an array substrate in some embodiments according to the present disclosure.

FIG. 1 is a plan view of an array substrate in some embodiments according to the present disclosure. Referring to FIG. 1, the array substrate in some embodiments includes a plurality of subpixel regions SR and an inter-subpixel region ISR. The inter-subpixel region ISR surrounds each of the plurality of subpixel regions SR. Optionally, the inter-subpixel region ISR is a unitary region. The plurality of subpixel regions SR are spaced apart from each other by the inter-subpixel region ISR. In some embodiments, the inter-subpixel region ISR includes a plurality of first regions R1, a respective first region of the plurality of first regions R1 surrounds a respective subpixel region of the plurality of subpixel regions SR. In some embodiments, the inter-subpixel region ISR further includes a plurality of third regions R3, a respective third region of the plurality of third regions R3 surrounds the respective first region of the plurality of first regions R1. In some embodiments, the inter-subpixel region ISR further includes a second region R2. Optionally, the second region R2 is a unitary region. The plurality of third regions R3 are spaced apart from each other by the second region R2.

As used herein, a subpixel region refers to a light emission region of a subpixel, such as a region corresponding to a pixel electrode in a liquid crystal display, or a region corresponding to a light emissive layer in a light emitting diode display panel, or a region surrounding by respective pixel definition rings according to the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in a light emitting diode display panel, or a region corresponding to a pixel definition layer in combination with a region between adjacent pixel definition ring structures according to the present disclosure. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 2:
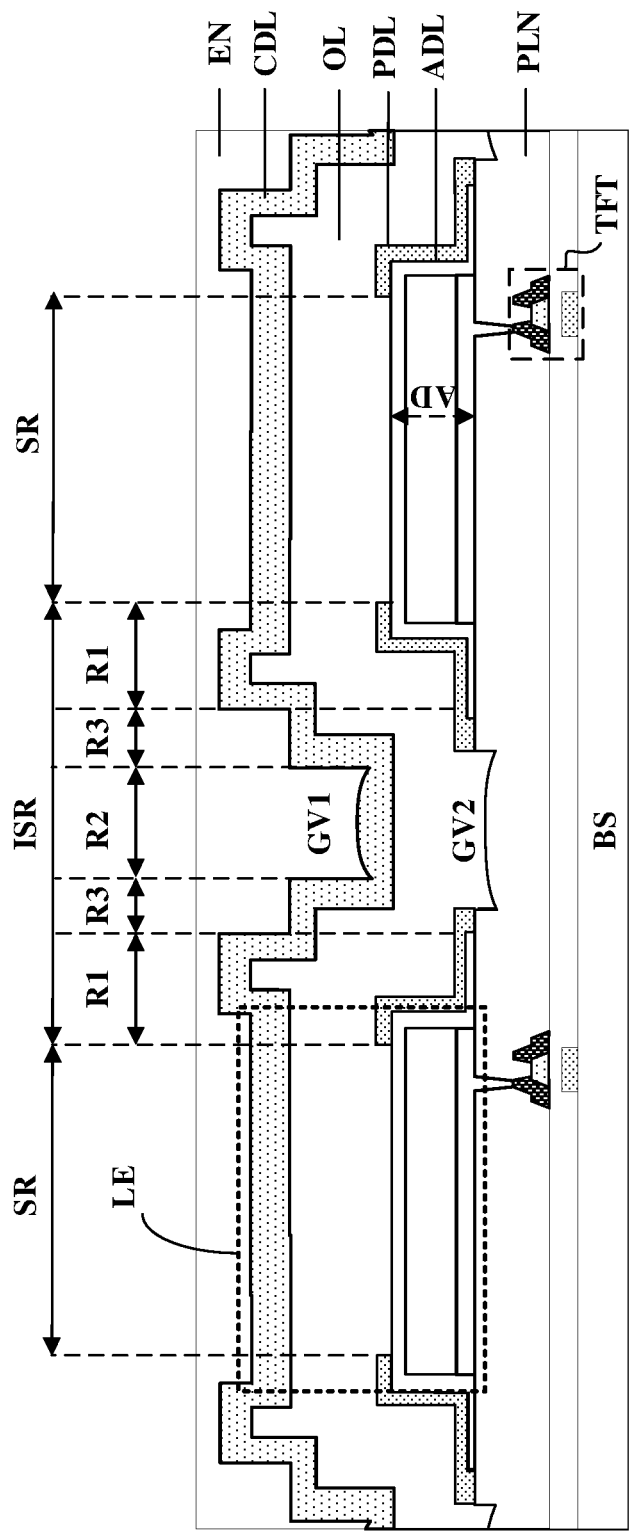
FIG. 2 is a cross-sectional view along an A-A' line in FIG. 1.
Figure 3:
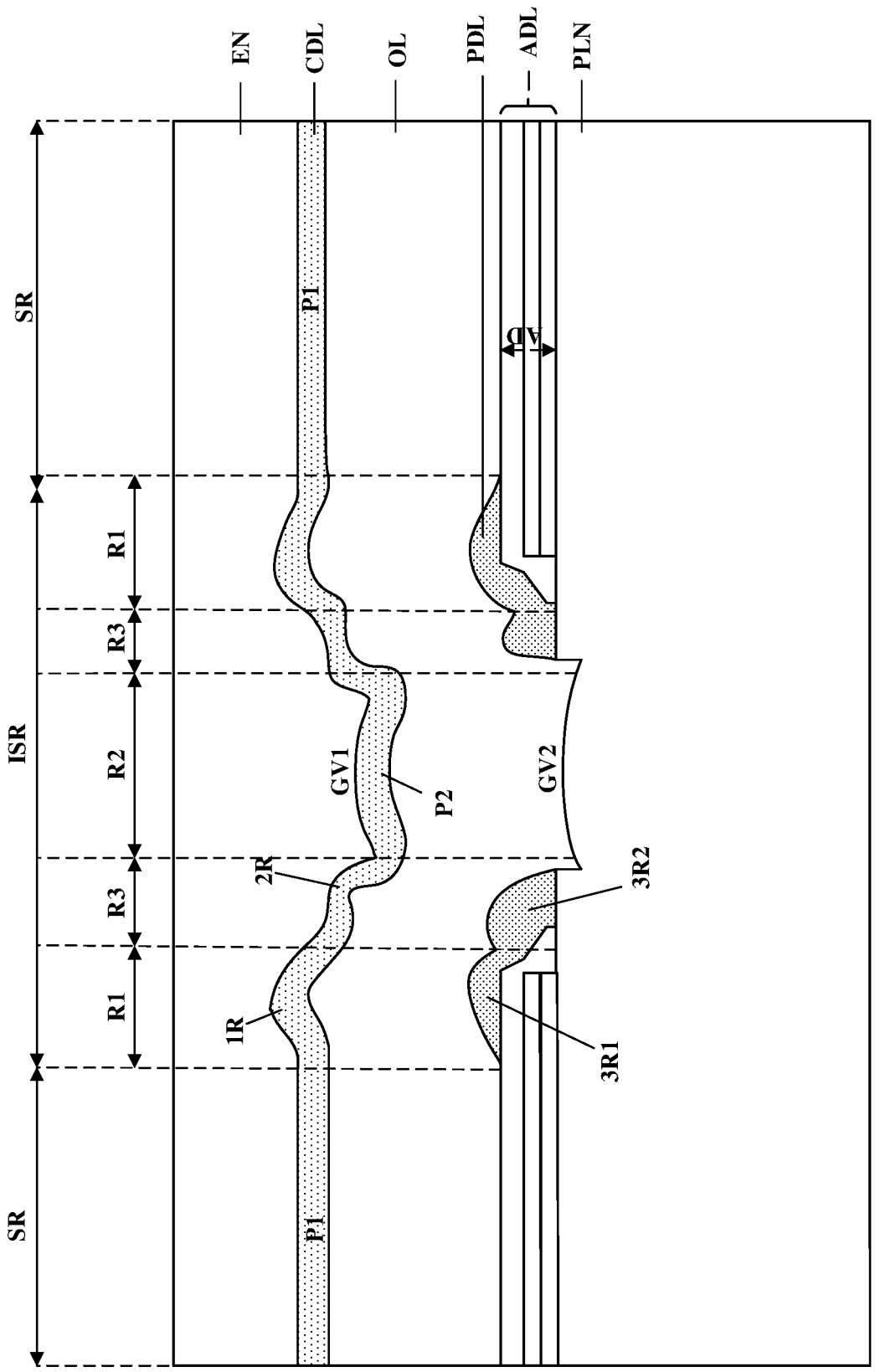
FIG. 3 is a cross-sectional view across two adjacent subpixel regions of an array substrate in some embodiments according to the present disclosure.

FIG. 2 is a cross-sectional view along an A-A' line in FIG. 1. FIG. 3 is a cross-sectional view across two adjacent subpixel regions of an array substrate in some embodiments according to the present disclosure. Referring to FIG. 2 and FIG. 3, the array substrate in some embodiments includes a plurality of light emitting elements LE, e.g., a plurality of organic light emitting elements. In some embodiments, the array substrate includes an anode layer ADL and a cathode layer CDL. Optionally, the anode layer ADL includes a plurality of anodes AD for the plurality of light emitting elements LE, respectively. A respective light emitting element includes a respective anode of the plurality of anodes AD, an organic layer OL, and a cathode (e.g., the cathode layer CDL). The array substrate further includes a plurality of thin film transistors TFT. A respective thin film transistor is connected to the anode AD in the respective light emitting element. Optionally, the cathode layer CDL is a unitary cathode layer extending across the plurality of subpixel regions SR and the inter-subpixel region ISR. Optionally, the organic layer OL includes a light emitting layer, e.g., an organic light emitting layer. Optionally, the organic layer OL further includes one or more functional layers such as an electron transport layer, an electron injection layer, an electron barrier layer, a hole transport layer, a hole injection layer, a hole barrier layer, and a charge generating layer. Optionally, at least one layer of the organic layer OL is a unitary layer extending across the plurality of subpixel regions SR and the inter-subpixel region ISR.

In some embodiments, the array substrate includes an encapsulating layer EN that encapsulates the plurality of light emitting elements LE. The encapsulating layer EN may include multiple sublayers. In one example, the encapsulating layer EN includes a first inorganic encapsulating sublayer on the cathode layer CDL, an organic encapsulating sublayer on a side of the first inorganic encapsulating sublayer away from the cathode layer CDL, and a second inorganic encapsulating sublayer on a side of the organic encapsulating sublayer away from the first inorganic encapsulating sublayer.

In some embodiments, the anode AD may include multiple sublayers. In one example, the anode AD includes a first sublayer made of a metallic material (e.g., titanium) on a planarization layer PLN, a second sublayer made of a metallic material (e.g., aluminum) on a side of the first sublayer away from the planarization layer PLN, and a third sublayer made of a metal oxide material (e.g., indium tin oxide) on a side of the second sublayer away from the first sublayer.

Figure 4:
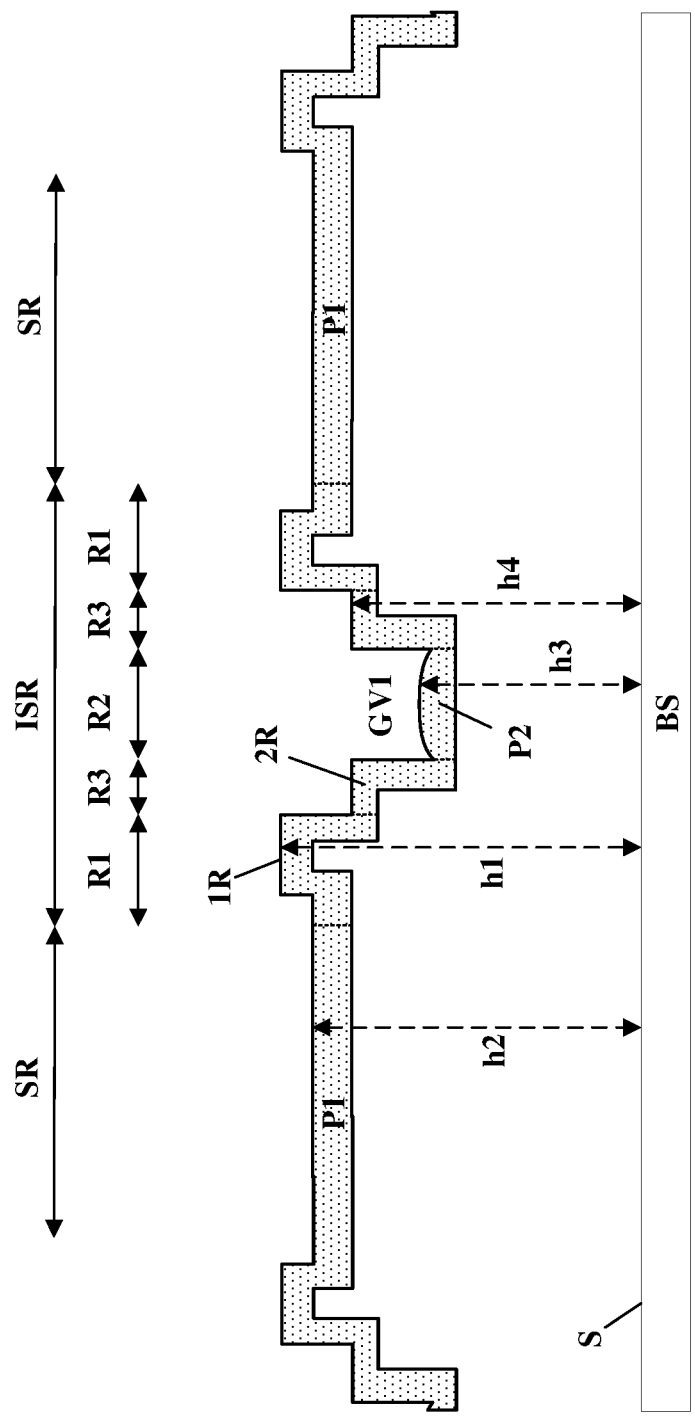
FIG. 4 illustrates the structure of a cathode layer in an array substrate in some embodiments according to the present disclosure.
Figure 5:
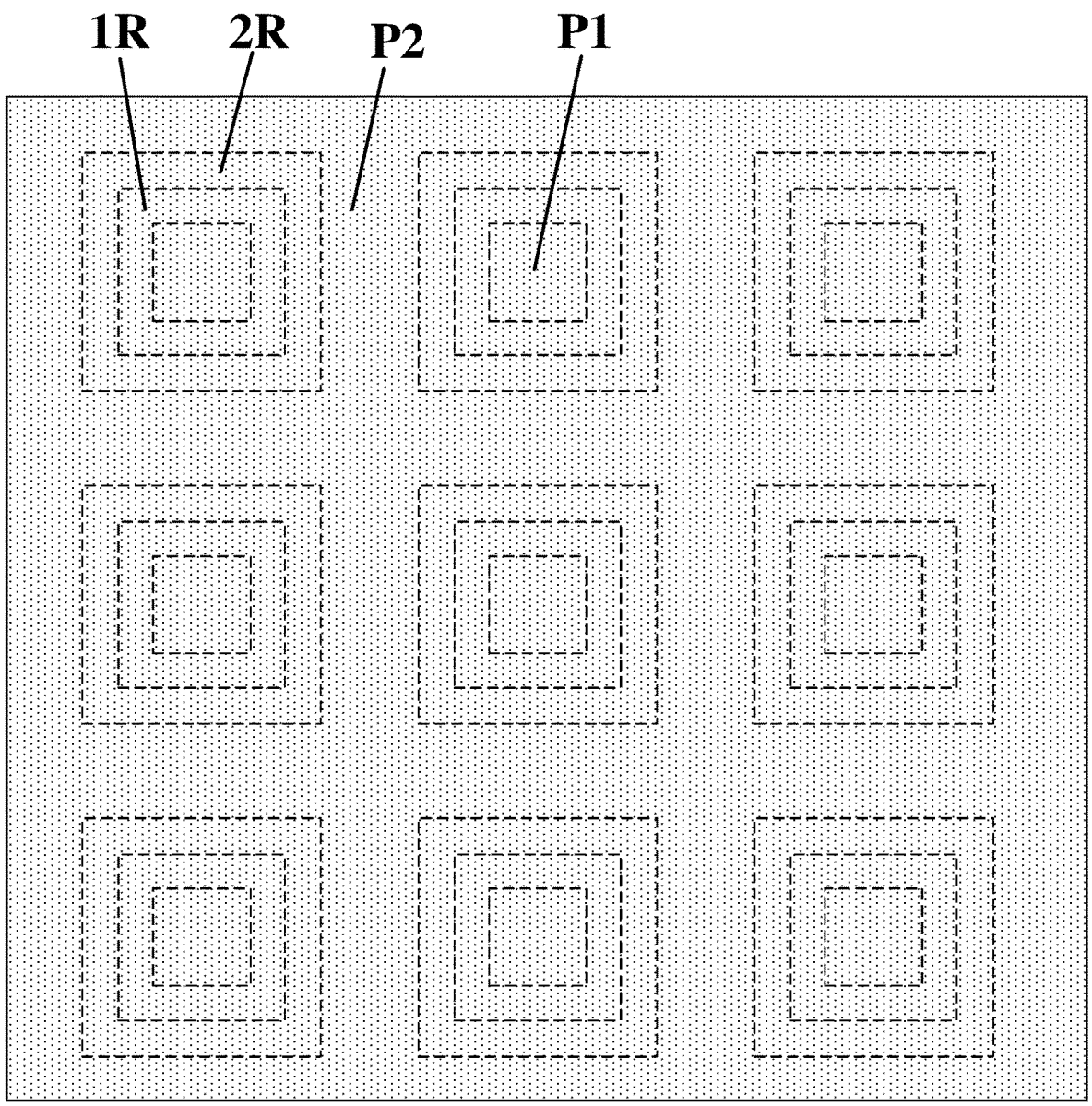
FIG. 5 is a plan view of a cathode layer in an array substrate in some embodiments according to the present disclosure.

FIG. 4 illustrates the structure of a cathode layer in an array substrate in some embodiments according to the present disclosure. FIG. 5 is a plan view of a cathode layer in an array substrate in some embodiments according to the present disclosure. Referring to FIG. 1 to FIG. 5, the cathode layer CDL in some embodiments includes a plurality of first ring structures 1R respectively in a plurality of first regions R1 of the inter-subpixel region ISR. Optionally, a respective first region of the plurality of first regions R1 surrounds a respective subpixel region of the plurality of subpixel regions SR. As shown in FIG. 5, the plurality of first ring structures 1R are spaced apart from each other. A respective first ring structure surrounds a respective first portion of a plurality of first portions P1 of the cathode layer CDL.

In some embodiments, a respective first ring structure of the plurality of first ring structures 1R protrudes away from a base substrate BS, forming a ridge. The ridge formed by the respective first ring structure surrounds the respective subpixel region SR.

In some embodiments, the cathode layer CDL further includes a plurality of first portions P1 in the plurality of subpixel regions SR, respectively. The plurality of first portions P1 are spaced apart from each other. The cathode layer CDL extends substantially evenly in a respective first portion of the plurality of first portions P1, then rises above the respective first portion when it transitions into the respective first ring structure. Optionally, a first height h1 of the respective first ring structure relative to a surface S of the base substrate BS is greater than a second height h2 of a respective first portion of the plurality of first portions P1 relative to the surface S of the base substrate BS. Optionally, the plurality of first portions P1 are portions of the cathode layer CDL having the greatest heights relative to the surface S of the base substrate BS.

In some embodiments, the cathode layer CDL forms a first groove GV1 in the inter-subpixel region ISR. Optionally, the first groove GV1 is in the second region R2 of the inter-subpixel region ISR. The first groove GV1 is formed in the second region because the cathode layer CDL extends in the second region R2 at a position closer to the base substrate BS as compared to in the plurality of first regions R1. Optionally, the first groove GV1 is a unitary groove extending throughout the second region R2, and the second region R2 is a unitary region.

In some embodiments, the cathode layer CDL further includes a second portion P2 in the second region R2 of the inter-subpixel region ISR. Optionally, the second portion P2 forms a base of the first groove VG1. The cathode layer CDL extends substantially evenly in a respective first portion of the plurality of first portions P1, then rises above the respective first portion when it transitions into the respective first ring structure, and then descends below the respective first portion when it transitions into the second portion P2. As shown in FIG. 4, the first height h1 of the respective first ring structure relative to the surface S of the base substrate BS is greater than a third height h3 of the second portion P2 relative to the surface S of the base substrate BS. Moreover, the second height h2 of the respective first portion relative to the surface S of the base substrate BS is also greater than the third height h3 of the second portion P2 relative to the surface S of the base substrate BS.

In some embodiments, referring to FIG. 1 and FIG. 5, the second portion P2 is a unitary portion extending throughout the second region R2 in the inter-subpixel region ISR between adjacent subpixel regions of the plurality of subpixel regions SR.

In some embodiments, the second portion P2 is not a flat portion. Referring to FIG. 3 and FIG. 4, the second portion P2 has a shape that protrudes away from the base substrate BS (for example, upward). This is due to the topology of underlying layers underneath the second portion P2.

Figure 6:
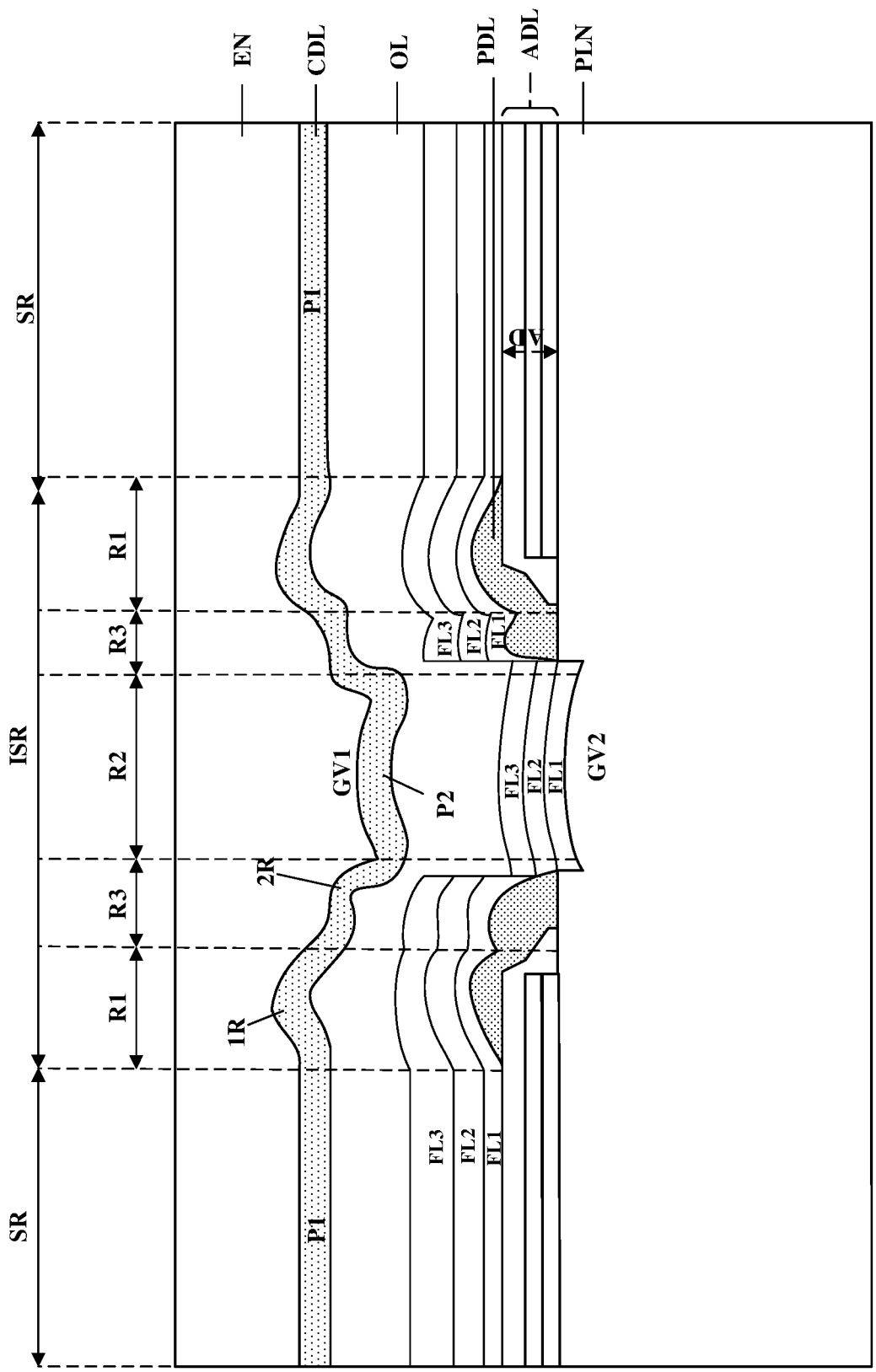
FIG. 6 is a cross-sectional view across two adjacent subpixel regions of an array substrate in some embodiments according to the present disclosure.

FIG. 6 is a cross-sectional view across two adjacent subpixel regions of an array substrate in some embodiments according to the present disclosure. Referring to FIG. 6, the organic layer OL in some embodiments includes a plurality of functional layer stacked together, for example, a first functional layer FL1, a second functional layer FL2, and a third functional layer FL3 as depicted in FIG. 6.

The array substrate in some embodiments further includes a second groove GV2 recessed into the planarization layer PLN. The second groove GV2 is at least partially in the second region R2. Optionally, the second groove GV2 is a unitary groove extending throughout the second region R2. Due to the presence of the second groove GV2, when a functional material layer are deposited onto the substrate, the deposited functional material layer are discontinued. For example, the first functional layer FL1 has a first part in the respective subpixel region, the respective first region, and at least partially in the respective third region on a first side of the second groove GV2, a second part in the respective subpixel region, the respective first region, and at least partially in the respective third region on a second side of the second groove GV2, and a third part at least partially in the second region R2. The first part, the second part, and the third part of the first functional layer FL1 are at least partially discontinuous parts at least partially segregated due to the presence of the second groove GV2. Similarly, the second functional layer FL2 has a first part in the respective subpixel region, the respective first region, and at least partially in the respective third region on a first side of the second groove GV2, a second part in the respective subpixel region, the respective first region, and at least partially in the respective third region on a second side of the second groove GV2, and a third part at least partially in the second region R2. The first part, the second part, and the third part of the second functional layer FL2 are at least partially discontinuous parts at least partially segregated due to the presence of the second groove GV2. Similarly, the third functional layer FL3 has a first part in the respective subpixel region, the respective first region, and at least partially in the respective third region on a first side of the second groove GV2, a second part in the respective subpixel region, the respective first region, and at least partially in the respective third region on a second side of the second groove GV2, and a third part at least partially in the second region R2. The first part, the second part, and the third part of the third functional layer FL3 are at least partially discontinuous parts at least partially segregated at least partially due to the presence of the second groove GV2.

Because the functional layers are discontinued in the second region R2 due to the presence of the second groove GV2, cross-talk between adjacent subpixels can be eliminated. In particular, when the organic layer OL includes a charge generating layer, it is important to ensure that the charge generating layer is discontinued between adjacent subpixels. By having the second groove GV2, the charge generating layer has a first part in the respective subpixel region, the respective first region, and at least partially in the respective third region on a first side of the second groove GV2, a second part in the respective subpixel region, the respective first region, and at least partially in the respective third region on a second side of the second groove GV2, and a third part at least partially in the second region R2. The first part, the second part, and the third part of the charge generating layer are discontinuous parts segregated at least partially due to the presence of the second groove GV2.

In some embodiments, the organic layer OL includes a light emitting layer. Optionally, the light emitting layer has a first part in the respective subpixel region, the respective first region, and at least partially in the respective third region on a first side of the second groove GV2, a second part in the respective subpixel region, the respective first region, and at least partially in the respective third region on a second side of the second groove GV2, and a third part at least partially in the second region R2. The first part, the second part, and the third part of the light emitting layer are discontinuous parts segregated at least partially due to the presence of the second groove GV2.

Due to the presence of the second groove GV2, the organic layer OL as a whole descends downwards and at least partially into the second groove GV2. In turn, the cathode layer CDL descends toward the second groove GV2, and itself forms a first groove GV1.

In some embodiments, a portion of the planarization layer PLN forms a bottom base of the second groove GV2. Optionally, the portion of the planarization layer PLN (the base of the second groove GV2) has a shape that protrudes away from the base substrate BS (for example, upward). The second portion P2 has a conforming shape that protrudes away from the base substrate BS.

In some embodiments, referring to FIG. 1 to FIG. 6, the cathode layer CDL further includes a plurality of second ring structures 2R respectively in a plurality of third regions R3 of the inter-subpixel region ISR. Optionally, a respective third region of the plurality of third regions R3 surrounding a respective first region. Optionally, a respective second ring structure of the plurality of second ring structures is connected to the respective first ring structure. Optionally, the respective second ring structure surrounds the respective first ring structure, the respective first ring structure being an inner ring, and the respective second ring structure being an outer ring.

In some embodiments, portions of the plurality of second ring structures 2R form side walls of the first groove GV1. Referring to FIG. 2 and FIG. 4, the respective second ring structure has a step structure, with a horizontal step top and a vertical step edge. The step edge of two adjacent second ring structures form side walls of a portion of the first groove GV1.

The respective second ring structure may be considered as an intermediate step between the respective first ring structure and the second portion P2, and connecting the respective first ring structure to the second portion P2. In some embodiments, referring to FIG. 4, the first height h1 of the respective first ring structure relative to the surface S of the base substrate BS is greater than a fourth height h4 of the respective second ring structure relative to the surface S of the base substrate BS. Optionally, the fourth height h4 of the respective second ring structure relative to the surface S of the base substrate BS is greater than the third height h3 of the second portion P2 relative to the surface S of the base substrate BS. Optionally, the second height h2 of the respective first portion relative to the surface S of the base substrate BS is greater than the fourth height h4 of the respective second ring structure relative to the surface S of the base substrate BS.

The inventors of the present disclosure discover that, surprisingly and unexpectedly, by having a pixel definition layer with a unique structure, risks of a false short between the cathode layer and the anode layer can be obviated. Moreover, referring to FIG. 6, the pixel definition layer PDL and the second groove GV2 provide a synergistic effect that facilitates segregation of the functional layer in the second region R2, eliminating cross-talk between adjacent subpixels.

Figure 7:
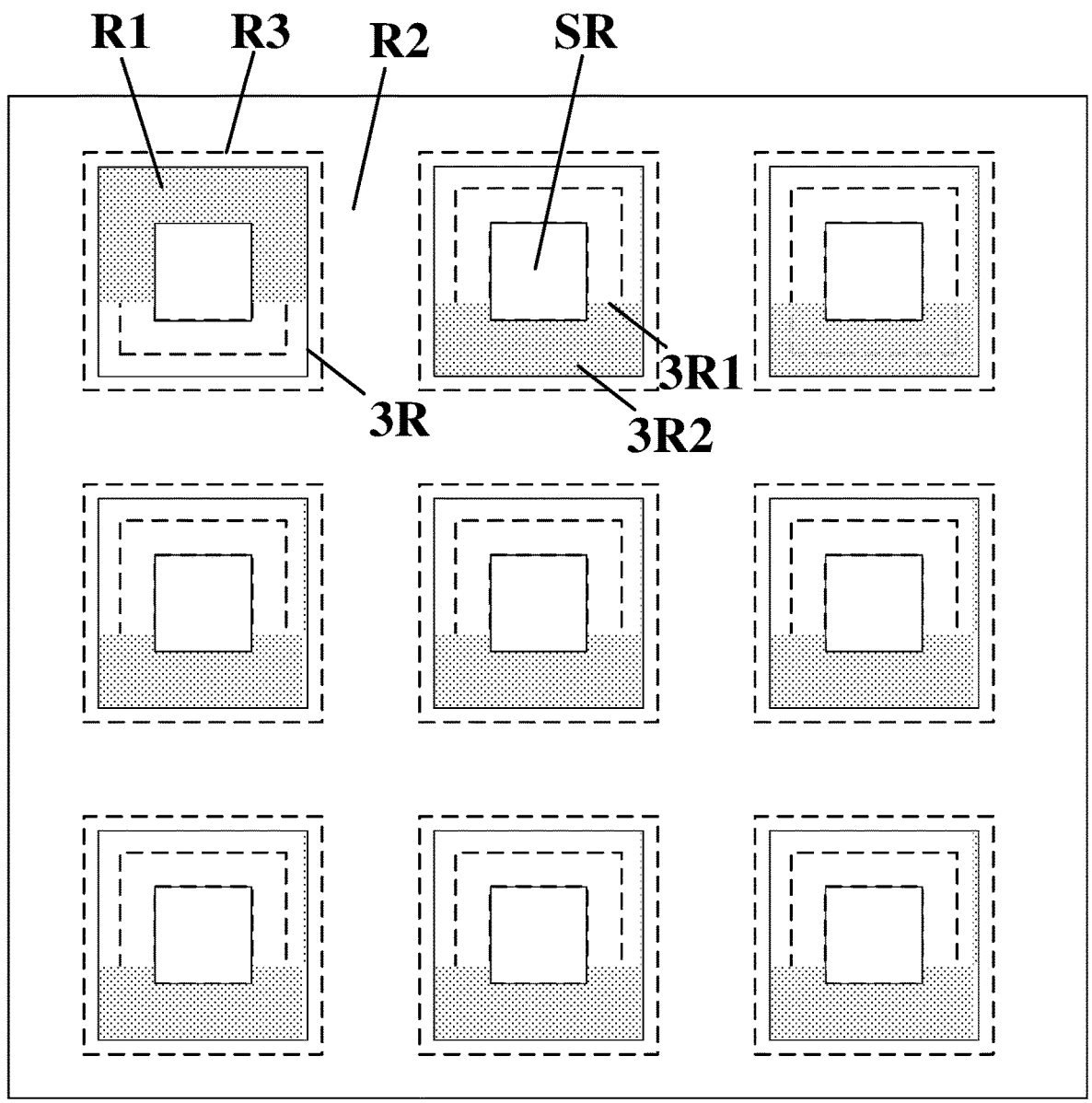
FIG. 7 is a plan view of a pixel definition layer in an array substrate in some embodiments according to the present disclosure.

FIG. 7 is a plan view of a pixel definition layer in an array substrate in some embodiments according to the present disclosure. Referring to FIG. 1 to FIG. 7, the pixel definition layer PDL in some embodiments includes a plurality of third ring structures 3R spaced apart from each other. Optionally, a respective third ring structure of the plurality of third ring structures 3R defines the respective subpixel region.

In some embodiments, the respective third ring structure is in the respective first region, and is at least partially in the respective third region. Referring to FIG. 2, FIG. 3, and FIG. 6, in some embodiments, an orthographic projection of the respective third ring structure on the base substrate BS at least partially overlaps with an orthographic projection of the respective first ring structure on the base substrate BS, and at least partially overlaps with an orthographic projection of the respective second ring structure on the base substrate BS. A respective third ring structure surrounds a respective subpixel region.

Referring to FIG. 3, in some embodiments, the respective third ring structure includes a first sub-ring structure 3R1 and a second sub-ring structure 3R2. Optionally, the first sub-ring structure 3R1 is connected with the second sub-ring structure 3R2. The first sub-ring structure 3R1 may be considered as an inner sub-ring, and the second sub-ring structure 3R2 may be considered as an outer sub-ring. In some embodiments, the first sub-ring structure 3R1 is not in contact with the planarization layer PLN and is on a side of a respective anode AD away from the planarization layer PLN. Optionally, the second sub-ring structure 3R2 is at least partially in contact with the planarization layer PLN. Optionally, the first sub-ring structure 3R1 is at least partially in contact with a first portion of a side wall of the respective anode AD. Optionally, the second sub-ring structure 3R2 is at least partially in contact with a second portion of a side wall of the respective anode AD. The second portion and the first portion are different portions.

In some embodiments, an orthographic projection of the first sub-ring structure 3R1 on the base substrate BS at least partially overlaps with an orthographic projection of the respective first ring structure on the base substrate BS. The ridge in the respective first ring structure is formed at least in part due to the presence of the first sub-ring structure 3R1 underneath the respective first ring structure.

In some embodiments, an orthographic projection of the second sub-ring structure 3R2 on the base substrate BS at least partially overlaps with an orthographic projection of a respective second ring structure on the base substrate BS. The step in the respective second ring structure is formed at least in part due to the presence of the second sub-ring structure 3R2 underneath the respective second ring structure.

In some embodiments, the pixel definition layer PDL is at least partially absent in second groove GV2. Optionally, the pixel definition layer PDL is completely absent in second groove GV2.

Figure 8:
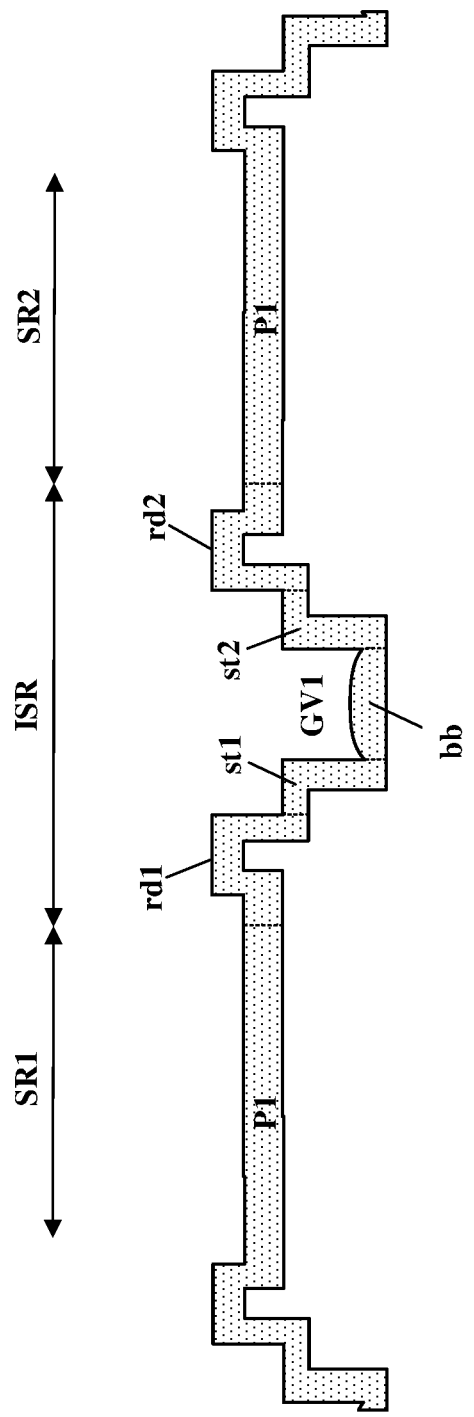
FIG. 8 is a cross-sectional view across two adjacent subpixel regions of an array substrate in some embodiments according to the present disclosure.

FIG. 8 is a cross-sectional view across two adjacent subpixel regions of an array substrate in some embodiments according to the present disclosure. Referring to FIG. 8, in a cross-section along a plane perpendicular to a surface of the base substrate BS, the cathode layer has a structure between two adjacent subpixel regions (SR1 and SR2) of the plurality of subpixel regions that first protrudes away from the base substrate forming a first ridge rd1 (associated with a first respective first ring structure), then steps down onto a first intermediate step st1 (associated with a first respective second ring structure), then further steps down onto a base bb (associated with the second portion P2) of a first groove, then steps up onto a second intermediate step st2 (associated with a second respective second ring structure), then further steps up and protrude away from the base substrate forming a second ridge rd2 (associated with a second respective first ring structure).

Figure 9:
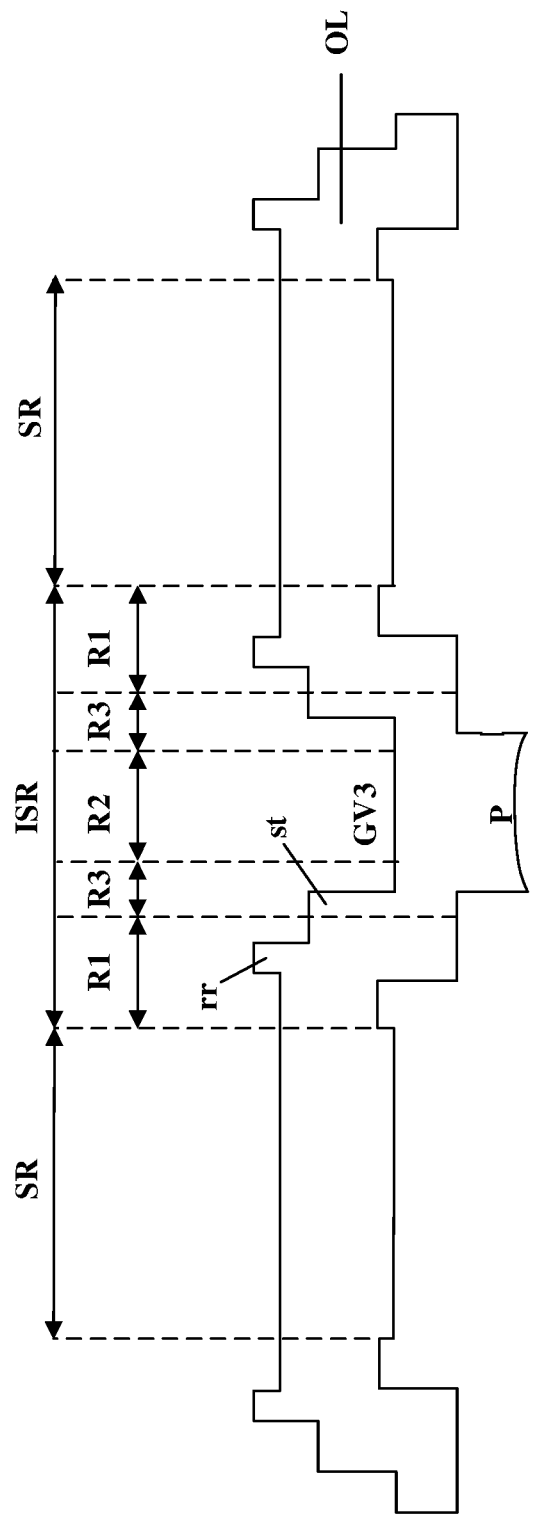
FIG. 9 illustrates the structure of an organic layer in an array substrate in some embodiments according to the present disclosure.

FIG. 9 illustrates the structure of an organic layer in an array substrate in some embodiments according to the present disclosure. Referring to FIG. 9, the organic layer OL in some embodiments forms a third groove GV3 in the inter-subpixel region ISR. Optionally, the third groove GV3 is in the second region R2, and partially in two adjacent third regions of the plurality of third regions R3. The third groove GV3 is formed due to the presence of the second groove in the planarization layer. The third groove GV3 and the second groove have conforming shapes. Optionally, the third groove GV3 is a unitary groove extending throughout at least the second region R2.

In some embodiments, the organic layer OL comprises a protrusion P protruding toward the base substrate. The protrusion P extends into the second groove, and has a shape complementary to the second groove. Optionally, the second groove GV2 is a unitary groove extending throughout at least the second region R2, and the protrusion P is a unitary protrusion extending throughout at least the second region R2.

Figure 10:
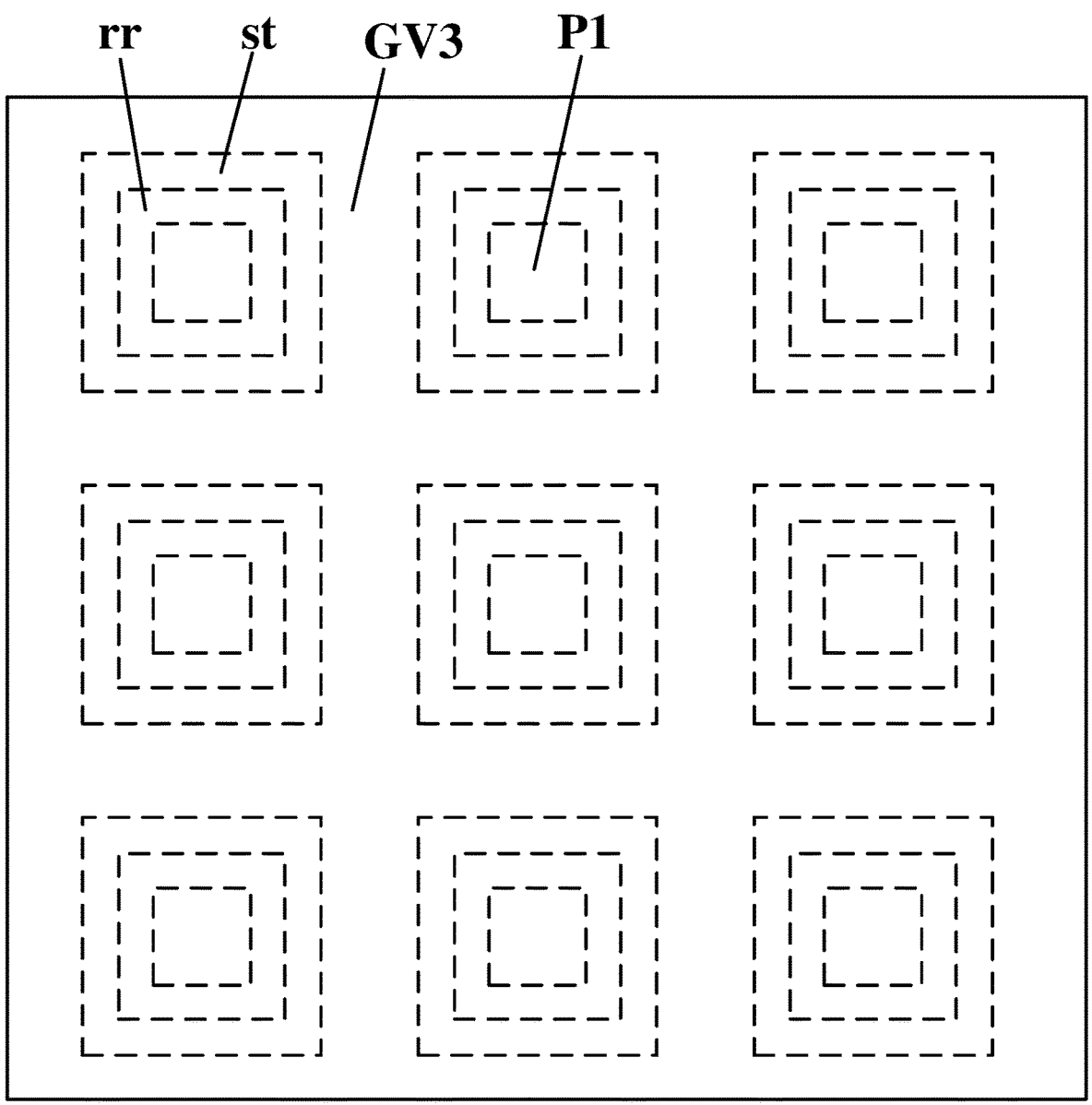
FIG. 10 is a plan view of an organic layer in an array substrate in some embodiments according to the present disclosure.

FIG. 10 is a plan view of an organic layer in an array substrate in some embodiments according to the present disclosure. Referring to FIG. 9 and FIG. 10, the organic layer OL in some embodiments includes a plurality of ridge ring structures rr respectively in a plurality of first regions R1 of the inter-subpixel region ISR. The plurality of ridge ring structures rr are spaced apart from each other (e.g., by at least the third groove GV3). A respective ridge ring structure surrounds a respective first portion of a plurality of first portions of the cathode layer.

In some embodiments, referring to FIG. 9 and FIG. 10, the organic layer OL further includes a plurality of step ring structures st. A respective step ring structure of the plurality of step ring structures st is partially in a respective first region and partially in a respective third region. Optionally, a respective step ring structure of the plurality of step ring structures st is connected to the respective first ring structure. Optionally, the respective step ring structure surrounds the respective ridge ring structure, the respective ridge ring structure being an inner ring, and the respective step ring structure being an outer ring.

In some embodiments, portions of the plurality of step ring structures st form side walls of the third groove GV3. Referring to FIG. 9 and FIG. 10, the respective step ring structure has a step structure, with a horizontal step top and a vertical step edge. The step edge of two adjacent step ring structures form side walls of a portion of the third groove GV3.

In some embodiments, at least one layer (e.g., a light emitting layer or a charge generating layer) of the organic layer OL is not a unitary layer, but segregated into a plurality of discontinuous parts segregated at least partially due to the presence of the second groove.

In some embodiments, the cathode layer extending across a plurality of subpixel regions and an inter-subpixel region has a unitary structure. Optionally, the plurality of first ring structures 1R, the plurality of second ring structures 2R, the plurality of first portions P1, and the second portion P2 are parts of the unitary structure.

FIG. 11 is a schematic diagram illustrating the structure of an organic layer in an array substrate in some embodiments according to the present disclosure. Referring to FIG. 11, the organic layer in some embodiments includes a first hole injection layer HIL1 on the respective anode AD, a first hole transport layer HTL1 on a side of the first hole injection layer HIL1 away from the respective anode AD, a first light emitting layer EML1 (e.g., a red light emitting layer) on a side of the first hole transport layer HTL1 away from the first hole injection layer HIL1, a second light emitting layer EML2 (e.g., a green light emitting layer) on a side of the first light emitting layer EML1 away from the first hole transport layer HTL1, a first electron transport layer ETL1 on a side of the second light emitting layer EML2 away from the first light emitting layer EML1, a charge generating layer CGL on a side of the first electron transport layer ETL1 away from the second light emitting layer EML2, a second hole injection layer HIL2 on a side of the charge generating layer CGL away from the first electron transport layer ETL1, a second hole transport layer HTL2 on a side of the second hole injection layer HIL2 away from the charge generating layer CGL, a third hole transport layer HTL3 on a side of the second hole transport layer HTL2 away from the second hole injection layer HIL2, a third light emitting layer EML3 (e.g., a blue light emitting layer) on a side of the third hole transport layer HTL3 away from the second hole transport layer HTL2, a hole barrier layer HBL on a side of the third light emitting layer EML3 away from the third hole transport layer HTL3, a second electron transport layer ETL2 on a side of the hole barrier layer HBL away from the third light emitting layer EML3, an electron injection layer EIL on a side of the second electron transport layer ETL2 away from the hole barrier layer HBL, and a cathode layer CDL on a side of the electron injection layer EIL away from the second electron transport layer ETL2.

Figure 12:
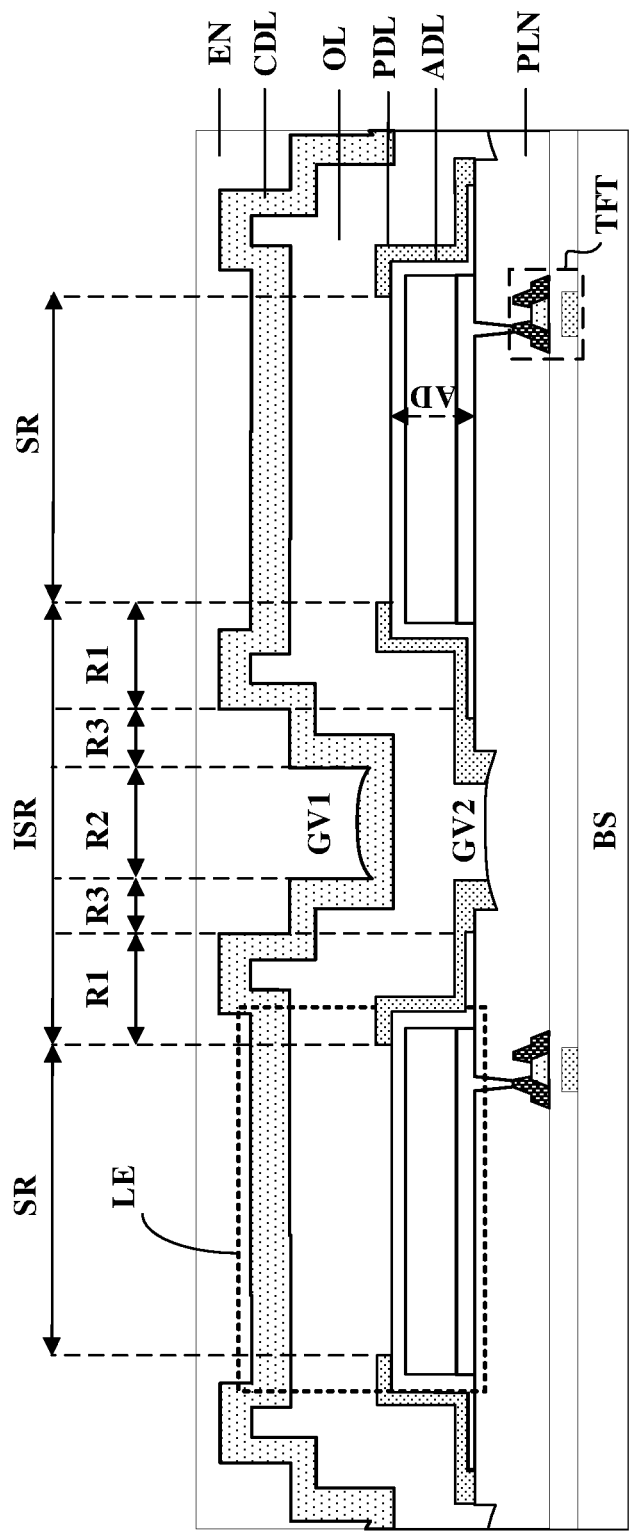
FIG. 12 is a cross-sectional view across two adjacent subpixel regions of an array substrate in some embodiments according to the present disclosure.

FIG. 12 is a cross-sectional view across two adjacent subpixel regions of an array substrate in some embodiments according to the present disclosure. Comparing the array substrate depicted in FIG. 12 with the array substrate depicted in FIG. 2, a respective third ring of the pixel definition layer PDL in the array substrate depicted in FIG. 12 is in the respective first region, in the respective third region, and partially in the second region R2.

In another aspect, the present disclosure provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a mini light emitting diode display apparatus.

In another aspect, the present disclosure provides a method of fabricating an array substrate. In some embodiments, the method includes forming a cathode layer extending across a plurality of subpixel regions and an inter-subpixel region. Optionally, forming the cathode layer includes forming a plurality of first ring structures respectively in a plurality of first regions of the inter-subpixel region. Optionally, a respective first region of the plurality of first regions surrounding a respective subpixel region of the plurality of subpixel regions. Optionally, a respective first ring structure of the plurality of first ring structures protrudes away from a base substrate, forming a ridge.

Various appropriate insulating materials and various appropriate fabricating methods may be used for making the planarization layer. For example, an insulating material may be deposited on the substrate by a plasma-enhanced chemical vapor deposition process. Examples of materials suitable for making the planarization layer include, but are not limited to, silicon oxide (SiOy), silicon nitride (SiNy, e.g., $Si_3N_4$), silicon oxynitride ($SiO_xN_y$), polydimethylsiloxane (PDMS).

Various appropriate insulating materials and various appropriate fabricating methods may be used to make the pixel definition layer. For example, an insulating material may be deposited on the substrate by a plasma-enhanced chemical vapor deposition process. Examples of materials suitable for making the pixel definition layer include, but are not limited to, silicon oxide (SiOy), silicon nitride (SiNy, e.g., $Si_3N_4$), silicon oxynitride ($SiO_xN_y$), and a photoresist material.

Various appropriate transparent electrode materials and various appropriate fabricating methods may be used to make the cathode layer. For example, a transparent electrode material may be deposited on the substrate by a plasma-enhanced chemical vapor deposition (PECVD) process. Examples of appropriate transparent electrode materials include, but are not limited to, various transparent metal oxide electrode materials and transparent nano-carbon tubes. Examples of transparent metal oxide materials include, but are not limited to, indium tin oxide, indium zinc oxide, indium gallium oxide, and indium gallium zinc oxide.

Various appropriate materials and various appropriate fabricating methods may be used to make the charge generating layer. Examples of charge generating materials include photogenerating pigments, such as metal phthalocyanines, metal free phthalocyanines, alkylhydroxyl gallium phthalocyanine, hydroxygallium phthalocyanines, perylenes, especially bis(benzimidazo)perylene, titanyl phthalocyanines, and the like, and more specifically, vanadyl phthalocyanines, Type V hydroxygallium phthalocyanines, and inorganic components such as selenium, selenium alloys, and trigonal selenium. The photogenerating pigment can be dispersed in a resin binder such as poly(vinylbutyral), poly(vinylcarbazole), polyesters, polycarbonates, poly(vinylchloride), polyacrylates and methacrylates, copolymers of vinyl chloride and vinyl acetate, phenolic resins, polyurethanes, poly(vinylalcohol), polyacrylonitrile, polystyrene, and the like.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a cathode layer extending across a plurality of subpixel regions and an inter-subpixel region;
   wherein the cathode layer comprises a plurality of first ring structures respectively in a plurality of first regions of the inter-subpixel region, a respective first region of the plurality of first regions surrounding a respective subpixel region of the plurality of subpixel regions; and
   a respective first ring structure of the plurality of first ring structures protrudes away from a base substrate, forming a ridge;
   wherein the cathode layer forms a first groove in the inter-subpixel region;
   the cathode layer further comprises a second portion in a second region of the inter-subpixel region, the second portion being a base of the first groove;
   the cathode layer further comprises a plurality of first portions in the plurality of subpixel regions, respectively; and
   a second height of a respective first portion of the plurality of first portions relative to a surface of the base substrate is greater than a third height of the second portion relative to the surface of the base substrate.

2. The array substrate of claim 1, wherein the cathode layer further comprises a plurality of first portions in the plurality of subpixel regions, respectively; and
   wherein a first height of the respective first ring structure relative to a surface of the base substrate is greater than a second height of a respective first portion of the plurality of first portions relative to the surface of the base substrate.

3. The array substrate of claim 1, wherein a first height of the respective first ring structure relative to a surface of the base substrate is greater than a third height of the second portion relative to the surface of the base substrate.

4. The array substrate of claim 1, wherein the second portion is a unitary portion extending throughout the second region in the inter-subpixel region between adjacent subpixel regions of the plurality of subpixel regions.

5. The array substrate of claim 1, wherein the second portion protrudes away from the base substrate.

6. An array substrate, comprising a cathode layer extending across a plurality of subpixel regions and an inter-subpixel region;
   wherein the cathode layer comprises a plurality of first ring structures respectively in a plurality of first regions of the inter-subpixel region, a respective first region of the plurality of first regions surrounding a respective subpixel region of the plurality of subpixel regions; and
   a respective first ring structure of the plurality of first ring structures protrudes away from a base substrate, forming a ridge;
   wherein the cathode layer further comprises a plurality of second ring structures respectively in a plurality of third regions of the inter-subpixel region, a respective third region of the plurality of third regions surrounding a respective first region; and
   wherein a respective second ring structure of the plurality of second ring structures is connected to the respective first ring structure.

7. The array substrate of claim 6, wherein the cathode layer forms a first groove in the inter-subpixel region; and
   portions of the plurality of second ring structures form side walls of the first groove.

8. The array substrate of claim 6, wherein a first height of the respective first ring structure relative to a surface of the base substrate is greater than a fourth height of the respective second ring structure relative to the surface of the base substrate.

9. The array substrate of claim 7, wherein the cathode layer further comprises a second portion in a second region of the inter-subpixel region, the second portion being a base of the first groove; and
   the respective second ring structure is a step connecting the respective first ring structure to the second portion.

10. The array substrate of claim 1, further comprising a pixel definition layer;
    wherein the pixel definition layer comprises a plurality of third ring structures spaced apart from each other; and
    a respective third ring structure of the plurality of third ring structures defines the respective subpixel region.

11. The array substrate of claim 10, wherein an orthographic projection of the respective third ring structure on the base substrate at least partially overlaps with an orthographic projection of the respective first ring structure on the base substrate, and at least partially overlaps with an orthographic projection of a respective second ring structure on the base substrate.

12. The array substrate of claim 10, further comprising a planarization layer on a side of the pixel definition layer closer to the base substrate;
    wherein the respective third ring structure comprises a first sub-ring structure and a second sub-ring structure, the first sub-ring structure connected with the second sub-ring structure;
    the first sub-ring structure is not in contact with the planarization layer and is on a side of a respective anode away from the planarization layer; and
    the second sub-ring structure is at least partially in contact with the planarization layer.

13. The array substrate of claim 12, wherein an orthographic projection of the first sub-ring structure on the base substrate at least partially overlaps with an orthographic projection of the respective first ring structure on the base substrate.

14. The array substrate of claim 12, wherein the cathode layer further comprises a plurality of second ring structures respectively in a plurality of third regions of the inter-subpixel region, a respective third region of the plurality of third regions surrounding a respective first region; and
    an orthographic projection of the second sub-ring structure on the base substrate at least partially overlaps with an orthographic projection of a respective second ring structure on the base substrate.

15. An array substrate, comprising a cathode layer extending across a plurality of subpixel regions and an inter-subpixel region, and a planarization layer on a side of the cathode layer closer to the base substrate;
    wherein the cathode layer comprises a plurality of first ring structures respectively in a plurality of first regions of the inter-subpixel region, a respective first region of the plurality of first regions surrounding a respective subpixel region of the plurality of subpixel regions; and a respective first ring structure of the plurality of first ring structures protrudes away from a base substrate, forming a ridge;

wherein the array substrate further comprises a second groove in the inter-subpixel region and partially extending into the planarization layer; and a pixel definition layer is at least partially absent in second groove.

16. The array substrate of claim 1, wherein, in a cross-section along a plane perpendicular to a surface of the base substrate, the cathode layer has a structure between two adjacent subpixel regions that first protrudes away from the base substrate forming a first ridge, then steps down onto a first intermediate step, then further steps down onto a base of a first groove, then steps up onto a second intermediate step, then further steps up and protrude away from the base substrate forming a second ridge.

17. A display apparatus, comprising the array substrate of claim 1, and an integrated circuit connected to the array substrate.

* * * * *